United States Patent
Wagoner et al.

(10) Patent No.: US 6,594,130 B2
(45) Date of Patent: Jul. 15, 2003

(54) METHOD AND CIRCUIT FOR THE PROTECTION OF A THYRISTOR

(75) Inventors: Robert Gregory Wagoner, Roanoke, VA (US); Lee Covington Robert, Roanoke, VA (US); Brian Mathew Hamill, Roanoke, VA (US)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 09/683,196

(22) Filed: Nov. 29, 2001

(65) Prior Publication Data

US 2003/0103305 A1 Jun. 5, 2003

(51) Int. Cl.[7] .............................. H02H 3/20; H02H 9/04
(52) U.S. Cl. ................... 361/91.7; 361/91.8; 363/34; 363/35; 363/37; 363/57
(58) Field of Search .................. 361/91.7, 91.8, 361/18, 9.18; 363/50, 54, 57, 85, 86, 96, 97, 98, 37

(56) References Cited

U.S. PATENT DOCUMENTS

| | | | | |
|---|---|---|---|---|
| 4,427,934 A | 1/1984 | Tupper | ........................ | 318/723 |
| 4,475,150 A | 10/1984 | D'Atre et al. | ................. | 363/51 |
| 4,570,212 A | 2/1986 | Edwards et al. | ............ | 363/138 |
| 4,602,199 A | 7/1986 | Walker | ........................ | 318/798 |
| 4,847,747 A | 7/1989 | Abbondanti | ................. | 363/138 |
| 4,870,338 A | 9/1989 | Abbondanti | ................. | 318/809 |
| 5,483,140 A | 1/1996 | Hess et al. | ................... | 318/802 |
| 5,712,587 A * | 1/1998 | Schauder et al. | ............ | 327/261 |
| 5,949,664 A * | 9/1999 | Bernet et al. | ................. | 363/34 |

* cited by examiner

Primary Examiner—Brian Sircus
Assistant Examiner—Boris Benenson
(74) Attorney, Agent, or Firm—Karl Vick; Kevin Duncan; Hunton & Williams

(57) ABSTRACT

Circuits and methods for protecting thyristors in a bridge configuration are provided. A circuit comprises a line reactor in series with the input of the bridge and the input of the diametric cell, two leg reactors each in series with a respective leg and an output of the diametric cell. Two snubber circuits in parallel with the two thyristors that comprise the diametric cell may also be used to protect the thyristors.

10 Claims, 4 Drawing Sheets

METHOD AND CIRCUIT FOR THE PROTECTION OF A THYRISTOR

BACKGROUND OF THE INVENTION

This invention relates to thyristor bridges. More specifically, this invention relates to a thyristor protection circuit that allows for a reduced size and improved placement of reactors necessary to protect the thyristors.

Thyristor bridges are solid state electrical devices that allow precise control of voltage and current. They are often controlled by logic units that interpret a broad range of signals and allow the thyristors to conduct over very precise intervals. Because of their controllability, they are often used in a broad range of applications such as analog to digital or digital to analog converters, power conversion devices, and frequency modulating devices.

Thyristor bridges are often used to control electric motors or start electric generators. In order to accomplish these tasks, control of both the frequency and magnitude of the magnetic field is preferable. Therefore, electric generator starters often include a thyristor bridge circuit for power conversion. A thyristor bridge may be employed to convert standard line voltage (such as generally available 60 Hz or 50 Hz alternating current electricity) into a direct current supply. This direct current supply may then be manipulated by a second thyristor bridge into alternating current having the desired frequency, magnitude, and phase angle.

The thyristors offer signal controllability, but they are often expensive and need to be protected from rapid increases in voltage across them and currents through them. FIG. 2 demonstrates one method to protect the thyristors 201–206 in a bridge configuration having large leg reactors 207–212. These large reactors often must be externally mounted around bus bars in series with a thyristor stack. The thyristor protection circuit may also have snubber circuits 213–218 placed in parallel with the thyristors 201–206. The thyristors 201–206 may be controlled by respective logic control units 219–224. FIG. 3 demonstrates a snubber circuit comprising a resistor 301 in series with a capacitor 302. The configuration here has some deficiencies such as high cost and mounting difficulties. Other problems with thyristor protection circuits also exist.

BRIEF SUMMARY OF INVENTION

The present invention overcomes the problems discussed above, and provides additional advantages, by employing a new circuit to protect thyristors in a bridge configuration. The invention modifies an existing bridge circuit by adding line reactors to the respective AC inputs of the diametric cells of a thyristor bridge. Among other benefits, this allows a reduction in the leg reactors that may be required in a traditional design. Part of the invention is a new snubber circuit added in parallel with the thyristors which, among other considerations, prevents excessive switching dv/dt that would otherwise occur due to the addition of the AC line reactors. In summary, the combination of the leg reactors, line reactors, and snubber circuits operate to protect the thyristors from rapid rates of anode current and voltage, unreasonably high peak voltage, and other limiting specifications.

One embodiment of the invention comprises a thyristor bridge rectifier device having diametric cells connected between DC bus lines, the diametric cells comprising two thyristors, line and leg reactors in series with the thyristors, and two snubber circuits in parallel with respective thyristors. In another embodiment of the invention, the aforementioned thyristor bridge rectifier is adapted to and employed in a load commutated inverter static starter system. Another embodiment of the invention is a method of protecting a thyristor in a bridge configuration. The method comprises the steps of operatively associating each thyristor in the bridge configuration with a leg-line-reactor protection mechanism.

DETAILED DESCRIPTION OF THE INVENTION

Figure 1:
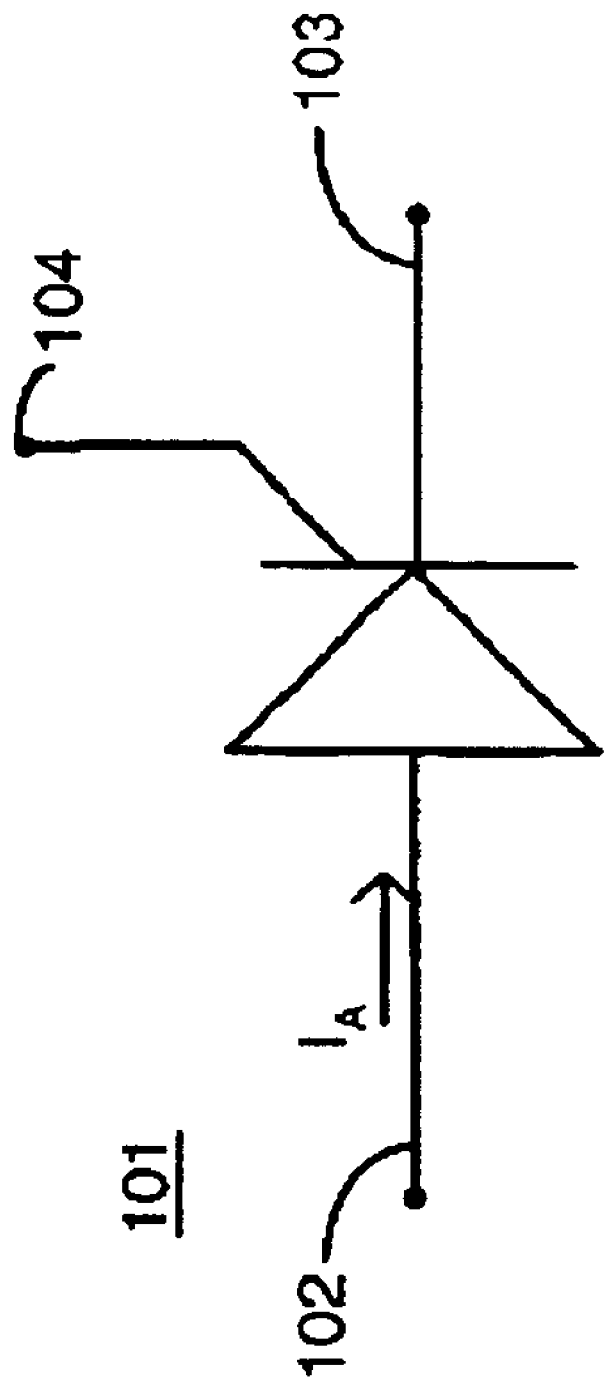
FIG. 1 is a symbol view of a silicon controlled rectifier (SCR).
Figure 3:
FIG. 3 is a schematic diagram of a snubber circuit used in a source thyristor bridge rectifier.
Figure 2:
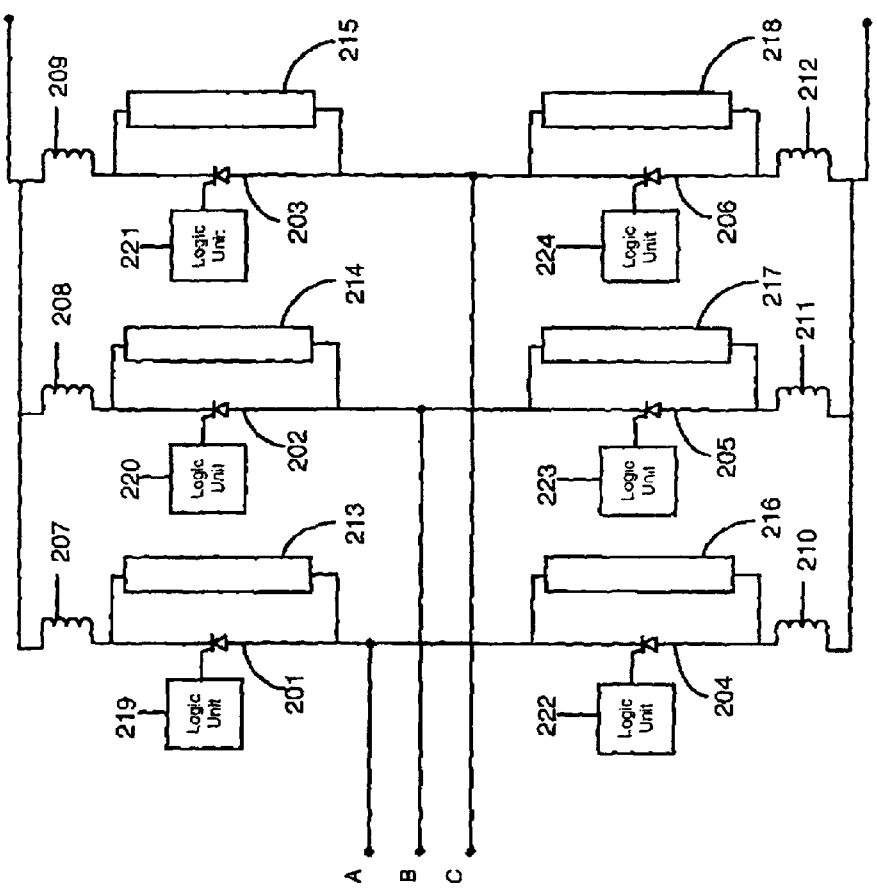
FIG. 2 is a schematic diagram of a source thyristor bridge rectifier.

Thyristors are known as three terminal devices. The standard silicon controlled rectifier (SCR) 101 shown in FIG. 1 is a common type of thyristor. It has an anode 102 and a cathode 103, much like a two terminal device, but also has a gate terminal 104. Without the gate control terminal 104 this device would function as a regular two terminal diode. If the voltage at the anode 102 is positive in relation to the cathode 103 (commonly known as forward biasing the device), and a sufficient pulse were added to the gate terminal to turn-on the SCR, current would flow in the positive direction as indicated by $I_A$. If the device were reverse biased, however, it would inhibit current flow in the reverse direction. The function of the gate terminal 104 is to allow the SCR 101 greater controllability over the standard diode. In order for the SCR 101 to conduct forward current $I_A$, the SCR 101 must be forward biased and a sufficient pulse must be applied to the gate terminal 104 for the SCR 101 to be turned on.

The SCR may not be turned off as easily. In order to turn off the SCR, the current $I_A$ shown in FIG. 1 must cease. This may be accomplished by adding a short circuit across the SCR that will draw the current away; opening the circuit driving the SCR; or driving a current in the opposite direction as $I_A$, more commonly referred to as reverse commutating the SCR. These characteristics are specifically what allow the SCR, or any thyristor, to be used in load commutated inverters, but they do have their drawbacks.

As with any electrical circuit element, thyristors have certain bounds within which they operate properly. For example, thyristors in their non-conductive state typically only allow a minimal leakage current to pass. If an excessive voltage is applied to the anode in relation to the cathode (i.e., an over voltage event, or $V_{max}$) the thyristor will most likely fail and become a short circuit. If the current running through a thyristor is allowed to change too rapidly (i.e., a large di/dt), the thyristor will most likely fail and become a permanent short circuit. In addition, if the voltage applied to a thyristor is allowed to change too rapidly (i.e., a large dv/dt), the thyristor may turn itself on and become a temporary short circuit, or it may fail and become a permanent short circuit.

The operating limitations of a thyristor are determined by its design, and may be verified through testing. In addition, the operating limitations may vary between manufacturers and models, and a particular model may have some variations in operating limits. For example, an ABB 6500V SCR is rated at a maximum over voltage value, $V_{max}$=6500V. The maximum rate of change of the current is $di/dt_{max}$<400 A/$\mu$s, and the maximum rate of change in the voltage is $dv/dt_{max}$<2000 V/$\mu$s. These parameters are tested at the factory, and the thyristor will operate properly as long as the circuit it is used in can control these parameters and keep them below these limits. Therefore, circuit elements may be used to protect a thyristor when it is part of a larger configuration.

Figure 4:
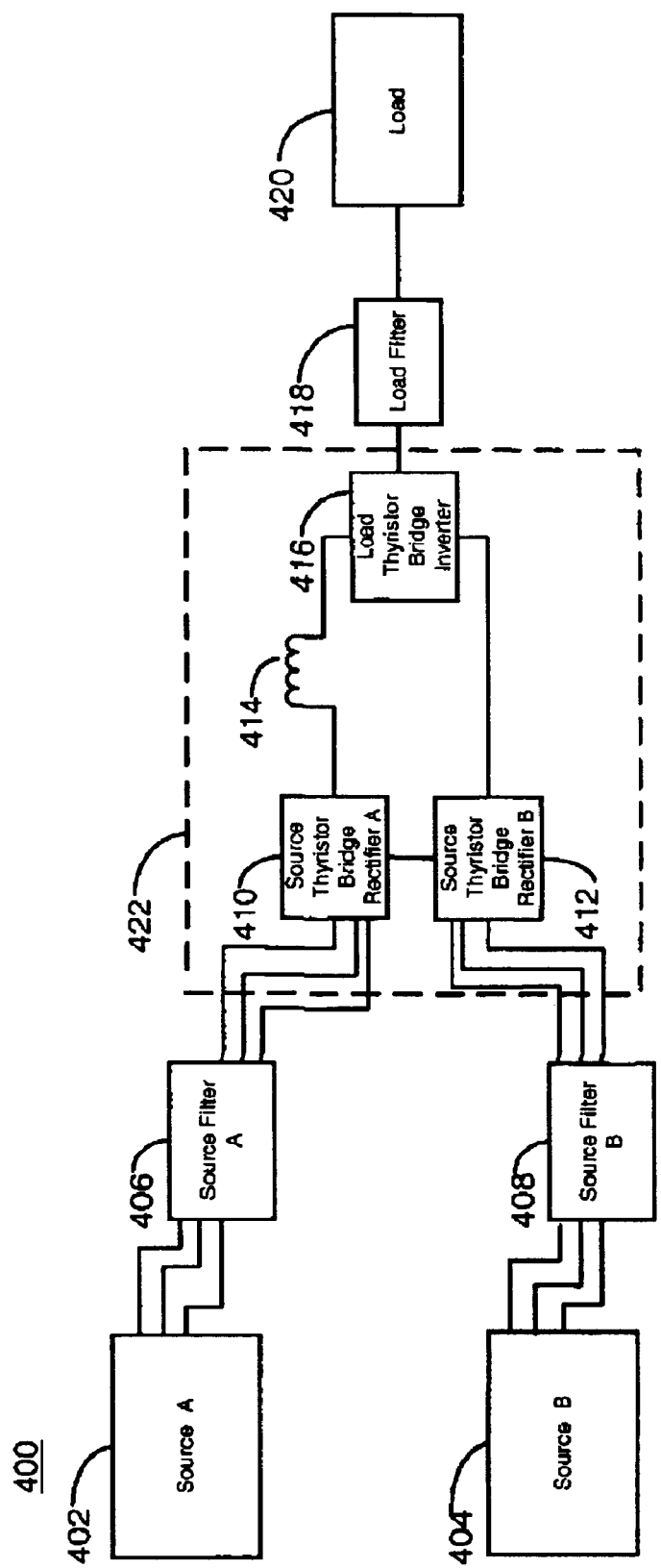
FIG. 4 is a top level block diagram of a load commutated inverter static starter.

An embodiment of the invention may be used with the load commutated inverter static starter (LCI) of an electric generator shown in FIG. 4. The LCI 400 may consist of two standard three phase sources 402 and 404, two source filters 406 and 408, two source thyristor bridge rectifiers 410 and 412, a direct current bus inductor 414, a load thyristor bridge inverter 416, a load filter 418, and a load 420. This configuration may be used to start an electric generator by supplying a selectively controlled electrical signal to create a corresponding magnetic force in the field of the generator. The two input sources 402 and 404 may be, for example, standard three phase 2080 VAC sources operating at 60 Hz. The three phase filters 406 and 408 may be included to control voltage transients during thyristor commutation. In an embodiment, the source filters may each be Y-connected wherein each leg of the Y comprises a resister and capacitor electrically in series with one another. Various input sources and source filters are known in the art, and the present invention is not intended to be limited to the exemplary sources and filters described herein.

The outputs of the two source filters 406 and 408 may be electrically coupled to the input of the power conversion circuit 422. The power conversion circuit 422 may convert a standard alternating current input to a selectively controlled alternating current output. The frequency, magnitude, and phase angles being selectively controlled to meet the system requirements. The power conversion circuit 422 may, for example, consist of two source thyristor bridge rectifiers 410 and 412, electrically coupled to a load thyristor bridge inverter 416 through a direct current bus inductor 414. The source thyristor bridge rectifiers 410 and 412 are used to convert an alternating current input to a variable direct current output. One embodiment of a source thyristor bridge rectifier 500 is shown in more detail in FIG. 5. In particular, the rectifier 500 includes thyristors 502, 504, 506, 508, 510, and 512. Triggering of the thyristors 502, 504, 506, 508, 510, and 512 is controlled by a corresponding logic unit 544, 546, 548, 550, 552, and 554. The logic units 544, 546, 548, 550, 552, and 554 are typically integrated into a single control system that may be remotely programmed and controlled. Power is supplied to thyristors 502, 504, 506, 508, 510, and 512 by the three phase inputs A, B, and C to the source bridge rectifier 500 through three line reactors 556, 558, 560. Further associated with each individual thyristor 502, 504, 506, 508, 510, and 512 is a small leg reactor 526, 528, 530, 532, 534, and 536 and a snubber circuit 514, 516, 518, 520, 522, and 524. Each thyristor and its associated leg reactor and snubber circuit comprise corresponding positive and negative legs 572, 574, 576, 578, 580, and 582 of the source thyristor bridge rectifier 500. Each pair of legs 572 and 578, 574 and 580, 576 and 582, combines to form respective diametric cells 538, 540, and 542 of the source thyristor bridge rectifier 500. Each pair of thyristors 502 and 508, 504 and 510, 508 and 512, has associated with it a leg-line-reactor protection mechanism (not circled). For the thyristor pair 502 and 508 this mechanism comprises its respective line reactor 556, and the two leg reactors 526 and 532 of its corresponding diametric cell.

In operation, each phase input A, B, C of the three phase AC source typically provides a voltage $V_S$=E*sin($\omega$t) to the source thyristor bridge rectifier 500. $V_S$ is positive when 0<$\omega$t<$\pi$ and $V_S$ is negative when $\pi$<$\omega$t<2$\pi$. The phase angle in radians is $\omega$, and the time t is measured in reference to a given time 0. E is the maximum peak to peak voltage of the input signal $V_S$. A thyristor 502 is typically only triggered when the AC voltage across it is positive. For the A phase positive thyristor 502 this only occurs when $V_{AB}$ or $V_{AC}$ is positive, where $V_{AB}$ and $V_{AC}$ are the voltage of phase A with respect to phase B or C respectively, thus there is a 180 degree interval over which the A phase positive thyristor can be triggered. Similar relationships occur for the other thyristors 504, 506, 508, 510, and 512. Full phase control requires firing angles that vary over a 180 degree interval.

The thyristors 502, 504, 506, 508, 510, and 512 are forward biased but remain in a blocking state (meaning no passage of electricity) until triggered by the logic unit 544, 546, 548, 550, 552, and 554. Selective control of the rectifier thyristors may be provided by a preprogrammed or dynamically programmed control system, such as a rack of control cards that contains all the control and protection algorithms of the LCI. The logic units 544, 546, 548, 550, 552, and 554 may be operated in conjunction with various internal status detection devices, not shown, to evaluate process commands and internal status signals to determine whether the drive should be in a stopped, started, alarmed, or faulted condition. These signals are typically provided at low current and voltage levels and are conditioned in the power bridge circuitry to provide the necessary isolation and power level.

When a thyristor 502 is triggered it starts conducting and remains conducting until after the voltage $V_{AC}$ reverses polarity and the current in the thyristor 502 is forced to substantially zero. The output voltage across the positive and negative DC output busses 568 and 570, respectively, of the thyristor bridge circuit 500 is driven at different time intervals by each diametric cell 538, 540, or 542. If one of the legs 572, 574, 576, 578, 580, or 582 is to fail, the DC output 568 and 570 would be severely affected by the negation of one third of the driving signal. This may make it necessary to shut down the system and replace the broken thyristor bridge. In accordance with an embodiment of the present invention, line reactors 556, 558, and 560 and leg reactors 526, 528, 530, 532, 534, and 536 work in conjunction with the snubber circuits 514, 516, 518, 520, 522, and 524 to protect the thyristors 502, 504, 506, 508, 510, and 512 from catastrophic failure. Three critical thyristor parameters that this circuit configuration may protect against are an excessive overall voltage across a thyristor (i.e., an over voltage), a rapid rate of rise in the thyristor input current (i.e., a large di/dt), and a rapid rate of rise in the thyristor input voltage (i.e., a large dv/dt).

Figure 5:
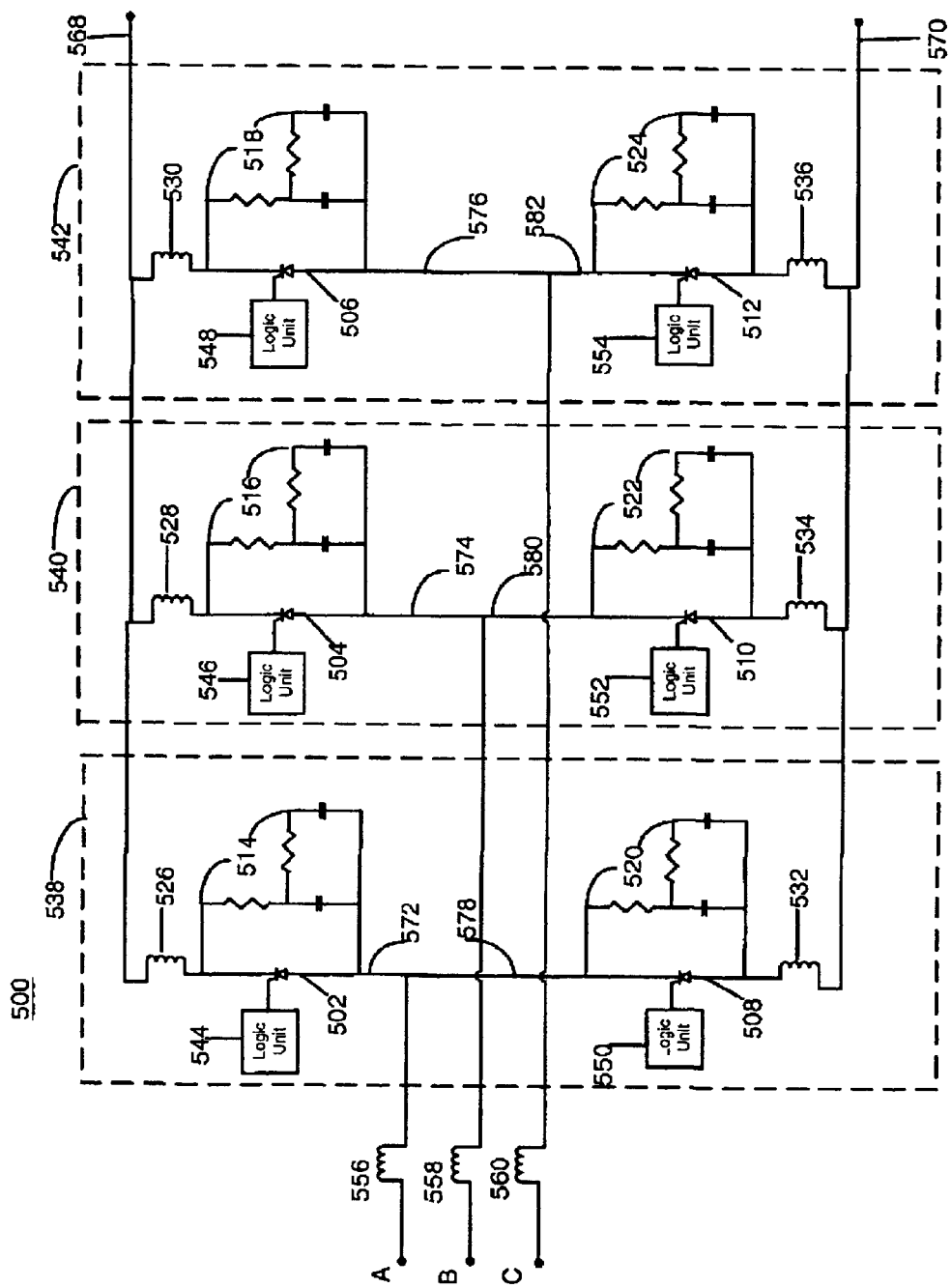
FIG. 5 is a schematic diagram of a modified source thyristor bridge rectifier.

For example, when a thyristor 502 of FIG. 5 is triggered by its corresponding logic unit 544, the voltage across the thyristor 502 is typically high and forward biased. If the thyristor 502 is a standard SCR, triggering occurs by applying a sufficient pulse to the gate to establish a turn-on gate current. The forward dynamic resistance of the conductive region of the SCR is typically 0.001 to 0.1 Ohms, depending upon the size of the thyristor. The thyristor turn-on is controlled by the spreading of the plasma within the thyristor junction, and the effective forward resistance changes from a blocking state to a conducting state very quickly. Therefore, the current through the SCR may be able to rise at a rate in excess of the acceptable di/dt rating of the SCR. The current is drawn from the phase input A, through the thyristor 502, and to the positive DC output bus 568. To counteract this rapid current change, the line reactor 556 works in conjunction with the leg reactor 526 to prevent an excessive rate of rise of the current through the thyristor 502 when it is initially triggered. The line and leg reactors 556, 526 are inductors and therefore resist changes in current. The inductive reactance of the line reactor 556 and the leg reactor 526 may be chosen to sufficiently limit the rate of rise of current through the thyristor 502 to prevent the current from exceeding the di/dt rating of the thyristor 502.

When the thyristor 502 is triggered a rapid voltage change (dv/dt) may occur across the other thyristor 508 of the diametric cell 538. This may occur because as the thyristor 502 is triggered it acts similar to a short circuit. Thus, the voltage difference between the positive DC bus 568 and negative DC bus 570 is no longer divided between both of the thyristors 502 and 508 in the diametric cell 538. Instead there may be a very small voltage drop across the triggered thyristor 502, and the majority of the voltage drop across the DC bus lines 568 and 570 may appear across the other thyristor 508 of the diametric cell 538. Because thyristors may trigger quickly, the change in voltages across the non-triggered thyristor 508 in the diametric cell 538 may occur very rapidly. In order to avoid a damaging voltage increase (dv/dt), the leg reactor 532 works with the snubber circuit 520 to limit the rate of change in voltage across the thyristor 508.

Additionally, when the thyristor 502 turns off a voltage spike may occur across the thyristor 502. At turn off, the voltage drop between the DC bus lines 568 and 570 is mainly across the other thyristor 508 of the diametric cell 538, but when the thyristor 508 turns off, the voltage drop is split between the two thyristors 502 and 508. While the voltage drop is re-apportioning, there may be a voltage spike or ringing across the thyristor 502 that is in the process of turning off. The turn off voltage is primarily controlled by the inductance in the phase input A (not shown) and the parallel combination of the input filter circuit (not shown) and the snubber circuit 514. These two elements work together to form an RLC circuit (resistor, inductor, capacitor), which rings based on the values of the resistance, inductance, and capacitance. These specific values may be chosen to limit the overshoot of voltage across the thyristor 502 to an acceptable level. Although only diametric cell 538 has been explained in detail, it is noted that diametric cells 540 and 542 work similarly with input B and C, respectively.

The teachings herein may be employed to create a device and method for protecting thyristors in a bridge circuit from excessive di/dt, dv/dt, and over voltage. The present invention may also comprise other benefits such as reduced reactor size and ease in constructing thyristor stack configurations.

It will be apparent to those skilled in the art that various modifications and variations can be made in the system of the present invention without departing from the spirit and scope of the invention. Thus, it is intended that the present invention cover the modifications and variations of this invention provided that they come within the scope of the appended claims and their equivalents.

What is claimed is:

1. A thyristor bridge rectifier device comprising:
    a first input, second input and third input;
    a first DC bus line;
    a second DC bus line,
    a first diametric cell operatively connected between the first and second DC bus lines, the first diametric cell having
        a first thyristor and a second thyristor operatively connected in series such that an anode of the first thyristor is operatively connected to a cathode of the second thyristor,
        a first leg reactor operatively connected in series with a cathode of the first thyristor and the first DC bus line,
        a second leg reactor operatively connected in series with an anode of the second thyristor and the second DC bus line,
        a first cell input operatively connected to the anode of the first thyristor; and
    a first line reactor operatively connected between the first input and the first cell input;
    a second diametric cell operatively connected between the first and second DC bus lines, the second diametric cell having
        a third thyristor and a fourth thyristor operatively connected in series such that an anode of the third thyristor is operatively connected to a cathode of the fourth thyristor,
        a third leg reactor operatively connected in series with a cathode of the third thyristor and the first DC bus line,
        a fourth leg reactor operatively connected in series with an anode of the fourth thyristor and the second DC bus line,
        a second cell input operatively connected to the anode of the third thyristor; and
    a second line reactor operatively connected between the second input and the second cell input; and
    a third diametric cell operatively connected between the first and second DC bus lines, the third diametric cell having
        a fifth thyristor and a sixth thyristor operatively connected in series such that an anode of the fifth thyristor is operatively connected to a cathode of the sixth thyristor,
        a fifth leg reactor operatively connected in series with a cathode of the fifth thyristor and the first DC bus line,
        a sixth leg reactor operatively connected in series with an anode of the sixth thyristor and the second DC bus line,
        a third cell input operatively connected to the anode of the fifth thyristor; and
    a third line reactor operatively connected between the third input and the third cell input.

2. The device of claim 1, wherein the diametric cell further comprises:
    a first snubber circuit operatively connected in parallel with the first thyristor, and
    a second snubber circuit operatively connected in parallel with the second thyristor.

3. The device of claim 2, wherein each of the first and second snubber circuits respectively comprise:
    a first snubber terminal; and
    a second snubber terminal,
    wherein the first snubber terminal is a terminal of a first resistor,
    the second snubber terminal is a terminal of a series element, the series element comprises a second resistor and a first capacitor connected in series with the second resistor, the first resistor and the series element are electrically coupled in series between the first snubber terminal and the second snubber terminal, and the series element is connected in parallel with a second capacitor.

4. A load commutated inverter static starter system comprising:

a power conversion device having a variable AC output;

an AC input voltage source having three phases operatively connected to the power conversion device; and a source bridge rectifier, the source bridge rectifier having
 a first input, second input and third input;
 a first DC bus line;
 a second DC bus line;
 a first diametric cell operatively connected between the first and second DC bus lines, the first diametric cell having
  a first thyristor and a second thyristor operatively connected in series such that an anode of the first thyristor is operatively connected to a cathode of the second thyristor,
  a first leg reactor operatively connected in series with a cathode of the first thyristor and the first DC bus line,
  a second leg reactor operatively connected in series with an anode of the second thyristor and the second DC bus line, and
  a first cell input operatively connected to the anode of the first thyristor; and
 a first line reactor operatively connected between the first input and the first cell input; and
 a second diametric cell operatively connected between the first and second DC bus lines, the second diametric cell having
  a third thyristor and a fourth thyristor operatively connected in series such that an anode of the third thyristor is operatively connected to a cathode of the fourth thyristor,
  a third leg reactor operatively connected in series with a cathode of the third thyristor and the first DC bus line,
  a fourth leg reactor operatively connected in series with an anode of the fourth thyristor and the second DC bus line,
  a second cell input operatively connected to the anode of the third thyristor; and
 a second line reactor operatively connected between the second input and the second cell input; and
 a third diametric cell operatively connected between the first and second DC bus lines, the third diametric cell having
  a fifth thyristor and a sixth thyristor operatively connected in series such that an anode of the fifth thyristor is operatively connected to a cathode of the sixth thyristor,
  a fifth leg reactor operatively connected in series with a cathode of the fifth thyristor and the first DC bus line,
  a sixth leg reactor operatively connected in series with an anode of the sixth thyristor and the second DC bus line,
  a third cell input operatively connected to the anode of the fifth thyristor; and third line reactor operatively connected between the third input and the third cell input.

5. The system of claim 4, wherein the diametric cell further comprises:

a first snubber circuit operatively connected in parallel with the first thyristor, and a second snubber circuit operatively connected in parallel with the second thyristor.

6. The system of claim 5, wherein each of the first and second snubber circuits respectively comprise:

a first snubber terminal; and a second snubber terminal, wherein the first snubber terminal is a terminal of a first resistor, the second snubber terminal is a terminal of a series element, the series element comprises a second resistor and a first capacitor connected in series with the second resistor, the first resistor and the series element are electrically coupled in series between the first snubber terminal and the second snubber terminal, and the series element is connected in parallel with a second capacitor.

7. A method for protecting a thyristor in a bridge configuration having a first thyristor and a second thyristor forming a diametric cell, the diametric cell operatively connected between a first DC bus line and a second DC bus line, the method comprising the steps of:

operatively associating a three phase bridge rectifier with an AC power supply;

operatively associating the first thyristor and the second thyristor with a first and a second leg-line-reactor protection mechanism, respectively;

selectively triggering the first thyristor;

automatically limiting a rate of change of a current level in the first thyristor using the first leg-line-reactor protection mechanism; and allowing the first thyristor to discontinue conductivity; and wherein the bridge configuration further includes:
 a second diametric cell operatively connected between the first and second DC bus lines, the second diametric cell having
  a third thyristor and a fourth thyristor operatively connected in series such that an anode of the third thyristor is operatively connected to a cathode of the fourth thyristor,
  a third leg reactor operatively connected in series with a cathode of the third thyristor and the first DC bus line,
  a fourth leg reactor operatively connected in series with an anode of the fourth thyristor and the second DC bus line; and
 a third diametric cell operatively connected between the first and second DC bus lines, the third diametric cell having
  a fifth thyristor and a sixth thyristor operatively connected in series such that an anode of the fifth thyristor is operatively connected to a cathode of the sixth thyristor,
  a fifth leg reactor operatively connected in series with a cathode of the fifth thyristor and the first DC bus line,
  a sixth leg reactor operatively connected in series with an anode of the sixth thyristor and the second DC bus line.

8. A method for protecting a thyristor in a bridge configuration having a first thyristor and a second thyristor forming a diametric cell, the diametric cell operatively connected between a first DC bus line and a second DC bus line, the method comprising the steps of:

operatively associating a three phase bridge rectifier with an AC power supply;

operatively associating the first thyristor and the second thyristor with a first and a second leg-line-reactor protection mechanism, respectively;

selectively triggering the first thyristor;

automatically limiting a rate of change of a voltage level in the second thyristor using the second leg-line-reactor protection mechanism; and allowing the first thyristor to discontinue conductivity; and wherein the bridge configuration further includes:

a second diametric cell operatively connected between the first and second DC bus lines, the second diametric cell having a third thyristor and a fourth thyristor operatively connected in series such that an anode of the third thyristor is operatively connected to a cathode of the fourth thyristor, a third leg reactor operatively connected in series with a cathode of the third thyristor and the first DC bus line, a fourth leg reactor operatively connected in series with an anode of the fourth thyristor and the second DC bus line; and a third diametric cell operatively connected between the first and second DC bus lines, the third diametric cell having a fifth thyristor and a sixth thyristor operatively connected in series such that an anode of the fifth thyristor is operatively connected to a cathode of the sixth thyristor, a fifth leg reactor operatively connected in series with a cathode of the fifth thyristor and the first DC bus line, a sixth leg reactor operatively connected in series with an anode of the sixth thyristor and the second DC bus line.

9. The method of claim 7 further comprising the step of:

automatically limiting an over voltage in the first thyristor using the first leg-line-reactor protection mechanism while the first thyristor is discontinuing conductivity.

10. The method of claim 8 further comprising the step of:

automatically limiting an over voltage in the first thyristor using the first leg-line-reactor protection mechanism while the first thyristor is discontinuing conductivity.

\* \* \* \* \*